US005505158A

United States Patent [19]
Thorpe, Jr. et al.

[11] Patent Number: 5,505,158
[45] Date of Patent: Apr. 9, 1996

[54] APPARATUS AND METHOD FOR ACHIEVING GROWTH-ETCH DEPOSITION OF DIAMOND USING A CHOPPED OXYGEN-ACETYLENE FLAME

[75] Inventors: Thomas P. Thorpe, Jr., Alexandria, Va.; Ronald A. Weimer, Boise, Id.

[73] Assignee: The United States of America as represented by the Secretary of the Navy, Washington, D.C.

[21] Appl. No.: 334,088

[22] Filed: Nov. 4, 1994

[51] Int. Cl.[6] .................................................. C30B 25/14
[52] U.S. Cl. ............................ 117/89; 117/102; 117/929; 427/450; 118/715
[58] Field of Search ........................... 117/929, 89, 102; 431/1, 8, 9, 21, 86, 88, 171; 423/446; 427/450; 118/715

[56] References Cited

U.S. PATENT DOCUMENTS

| | | | |
|---|---|---|---|
| 5,070,274 | 12/1991 | Yoshikawa et al. | 423/446 |
| 5,174,983 | 12/1992 | Snail et al. | 117/99 |
| 5,180,571 | 1/1993 | Hosoya et al. | 117/95 |

OTHER PUBLICATIONS

Thorpe, Jr. et al., "Novel Technique For Growth–Etch Cycling Of Flame–Deposited Diamond Films", Appl. Phys. Lett. 65 (19), 7 Nov. 1994, pp. 2490–2492.
Olson et al., "Sequential Growth Of High Quality Diamond Films From Hydrocarbon And Hydrogen Gases", Mat. Res. Soc. Symp. Proc., vol. 242, 1992, pp. 43–49.
Cline et al., "Cyclic Deposition Of Diamond: Experimental Testing Of Model Predictions", J. Appl. Phys. 72(12, 15 Dec. 1992, pp. 5926–5940.
Tzeng et al., "Minimization Of Infrared Absorption Of Flame Deposited Diamond Films By Sequential Deposition And Etching Processes".
Wei et al., "Growth Of Diamond By Sequential Deposition And Etching Process Using Hot Filament CVD", J. of Crystal Growth 128 (1993) pp. 413–419.
Weimer et al., "Examination Of The Chemistry Involved In Microwave Plasma Assisted Chemical Vapor Deposition Of Diamond", J. Mater. Res., vol. 6, No. 10, Oct. 1991, pp. 2134–2144.
Ravi, "Alternating Chemistry Sythesis Of Diamond".
Wang et al., "Analysis Of Cyclic Deposition Of Diamond", J. Appl. Phys., vol. 70, No. 11, 1 Dec. 1991, pp. 7132–7135.
Mucha et al., "On The Role Of Oxygen And Hydrogen In Diamond–Forming Discharges", J. Appl. Phys. 65(9), 1 May 1989, pp. 3448–3452.
Evans, "Changes Produced By High Temperature Treatment Of Diamond", Academic Press Harcourt Brace Jovanovich, Publishers, 1979, pp. 402–407.
Hanssen et al., "Diamond And Non–Diamond Carbon Synthesis In An Oxygen–Acetylene Flame", Thin Solid Films, 196 (1991) pp. 271–281.
Ravi, "Low Pressure Diamond Synthesis For Electronic Applications", Mater. Sci. & Engin., B19 (1993) pp. 203–227.
Deryagin et al., "Heterogeneous Crystallization Of Diamond From The Gaseous Phase", Surface & Coatings Tech., vol. 38, No. 1–2, Oct. 1989, pp. 79–122.

Primary Examiner—Robert Kunemund
Attorney, Agent, or Firm—Ajay S. Pathak; Thomas E. McDonnell

[57] ABSTRACT

A novel apparatus and method for the cyclic growth-etch deposition of diamond on a substrate by flame chemical vapor deposition (CVD) is developed. The cyclic growth-etch diamond deposition is accomplished by placing a suitable substrate to be coated under a CVD flame and providing a disk or face plate or other shapes having one or more teeth (or holes) wherein upon rotation of the disk, or face plate, or other shape, the teeth attached to the disk, or face plate, or other shape obstruct the path of the CVD flame from contacting the substrate at a desired time scale of $\tau_{growth}$ and $t_{cycle}$ to produce high quality (FWHM of 1–3.5 $cm^{-1}$) diamond.

24 Claims, 5 Drawing Sheets

APPARATUS AND METHOD FOR ACHIEVING GROWTH-ETCH DEPOSITION OF DIAMOND USING A CHOPPED OXYGEN-ACETYLENE FLAME

BACKGROUND OF THE INVENTION

1. Field of the Invention

The invention relates to a method and apparatus for achieving growth-etch deposition of diamond. More particularly, the invention relates to a method and apparatus for controlling the growth-etch cycle during flame deposition of diamond to promote the growth of diamond crystals of superior size and quality.

2. Description of the Related Art

It has been observed in the diamond field that the physical properties of diamond films may be enhanced by varying experimental parameters during film deposition so that growth is periodically interrupted by surface etching. The etch rate of diamond is less than the etch rates of non-diamond carbon deposits. If cycling parameters are properly selected (cycling period, growth period, the etchant gases, the growth gases etc.), it is possible to grow higher quality diamond at higher growth rates.

Various investigators of the artificial growth of diamond have studied the cyclic process of diamond deposition. Cyclic deposition processes involve a growth step alternated with an etching step. Cyclic diamond deposition processes involve a growth step wherein a carbon rich growth mixture is presented at a substrate growth surface followed by an etching step wherein an oxygen and/or hydrogen containing carbonless or carbon-lean gas mixture is presented at the substrate growth surface. For example, in a paper by H. Wang and M. Frenklach entitled Analysis of cyclic deposition of diamond appearing in the J. Appl. Phys., Vol. 70 No. 11, pp. 7132–7136 (1 Dec. 1991), incorporated herein in its entirety and for all purposes, the authors make theoretical predictions about the growth of diamond. Wang et al. state that a cyclic process of diamond deposition wherein two alternating steps, a growth step and an etching step produce better quality diamonds at a higher growth rate than if no etching was conducted. Wang et al. predict, according to their model, that:

{An} increase in the film growth rate, accompanied with the improvement in the film quality, can be achieved by shortening the duration of the total cycle and prolonging its growth part.

See id. at pp. 7135. Wang et al. are referring to a cyclic deposition and etching process wherein a total cycle time denoted by $t_{cycle}$ is the total period of time necessary to complete a singular deposition step followed by a singular etching step. The total cycle time, $t_{cycle}$, is the sum of the deposition time denoted by $t_{growth}$ and the etching time denoted by $t_{etching}$. Thus, the total cycle can be expressed as follows:

$$t_{cycle} = t_{growth} + t_{etching}$$

and the ratio of the deposition time to the cycle time, $\tau_{growth}$, is expressed as follows:

$$\tau_{growth} = t_{growth}/t_{cycle}.$$

At $\tau_{growth}=1.0$, the $t_{cycle}=t_{growth}$ and $t_{etching}=0$. Wang et al. further predict that:

{B}est deposition conditions . . . occur at total cycle durations shorter than about 30 ms, with the growth cycle fractions larger than 90%. At these conditions, the predicted $sp^2$ content {non-diamond} in the film is very low and the average linear film growth rate is about 20 μm/h, i.e. almost ten times larger than the growth rate computed for the original 1+4 min. cycle . . . These results are theoretical predictions. It is now of interest to test them by actual experiment.

See id. at pp. 7135.

W. A. Weimer, F. M. Cerio and C. E. Johnson examine the chemistry involved in the microwave plasma assisted deposition of diamond. Weimer and colleagues examine the effect of various cycle times and growth times on the quality and growth rate of diamond accomplished by microwave plasma assisted deposition of diamond. W. A. Weimer, F. M. Cerio and C. E. Johnson, authors of Examination of the chemistry involved in microwave plasma assisted chemical vapor deposition of diamond appearing in J. Mater. Res., Vol. 6, No. 10, pp. 2134–2144 (October 1991), incorporated herein by reference in its entirety and for all purposes, state that:

No beneficial effects were observed using alternating growth/etch cycles to deposit films. Films grown using $CH_4$ as the carbon source gas consistently produce higher quality diamond films compared to films grown from $C_2H_4$.

Improvement of film quality resulting from increased etching times was not observed for either case. Consequently, there is no benefit in depositing diamond using a cyclic deposit/etch scheme (on the time scale of our experiments) when either hydrogen or oxygen is the etchant.

See id. at pp. 2134, 2140. The time scales used by Weimer et al. were $t_{cycle}=4$ minutes and $t_{growth}=4$ minutes, 3 minutes, 2 minutes and 1 minute, respectively, for the $H_2$ etch. In addition, the time scales used by Weimer et al. were $t_{cycle}=4$ minutes and $t_{growth}=4$ minutes, 3.60 minutes, 3.40 minutes and 3 minutes, respectively, for the $H_2/O_2$ etch. Weimer et al. do state that While the chemistry in a plasma is expected to be different in many respects from that for the thermally driven hot filament or a flame, there are definitely some similarities.

Addition of low levels of $O_2$ to the reactor gas feed led to accelerated carbon deposition rates and enhanced $C_2H_2$ concentrations in the reactor exhaust gas . . . Excessive $O_2$ additions result in reduced growth rates. We have found no benefit to growing diamond using an alternating growth/etch scheme.

(Emphasis added.) See id. at pp. 2137, 2143.

K. V. Ravi examines the cyclic deposition process of growing diamonds on a substrate using microwave plasma chemical vapor deposition (CVD) using a $CH_4$—$H_2$ growth mixture and $O_2$—$H_2$ etch mixture. In a paper by K. V. Ravi entitled Alternating Chemistry Synthesis of Diamond appearing in Proceedings of the Second International Symposium of Diamond Materials edited by A. J. Purdes, K. E. Spear, B. S. Meyerson, M. Yoder, R. Davis and J. C. Angus, THE ELECTROCHEMICAL SOCIETY, Pennington, N.J., pp. 31–38 (1991), incorporated herein by reference in its entirety and for all purposes, the author states that:

By alternating diamond synthesis with the activation of the diamond surface with oxygen it is shown that good quality diamond can be synthesized at methane concentrations up to 15% in hydrogen.

See id. at pp. 31. Ravi further states that:

It is well established that as methane concentration is increased the concentration of non-diamond phases in the diamond increases . . . Alternating chemistry synthesis of diamond has been achieved by alternating between methane-hydrogen discharge and an oxygen-hydrogen discharge . . . Methane and oxygen were alternatively added to the hydrogen discharge to achieve diamond growth (methane cycle) and diamond etching (oxygen cycle) respectively. The concentrations of methane and oxygen as well as the times of the two processes were varied. Typical times, in a cycle, ranged, from 2 to 5 minutes for diamond deposition alternated with 0.5 to 2 minutes for diamond etching. (Emphasis added.) See id. at pp. 32.

Olson and colleagues performed cyclic deposition experiments using a reactor that incorporates a rotating substrate stage and physically separated hot-filament-activated growth and etch sections wherein the substrate stage is rotated through the growth and the etch sections in sequential alternate fashion. In a paper by Olson et al. entitled Sequential Growth of High Quality Diamond Films from Hydrocarbon and Hydrogen Gases appearing in Mat. Res. Soc. Symp., Materials Research Society, Vol. 242, pp. 43–49 (1992), incorporated herein in its entirety and for all purposes, the authors disclose a method of carrying out sequential growth and etching by mounting a substrate on a rotating face plate which is rotated so that the substrate is exposed sequentially to a diamond growth reactant gas mixture followed by exposure to a diamond etchant reactant gas mixture wherein the substrate and reactant gases are heated by hot filament.

In the specific case of diamond film deposition with an oxygen-acetylene torch, the growth-etch cycle may be accomplished by varying the depositing film's exposure to oxygen, a strong etchant of carbon at substrate temperatures typical to diamond deposition (~800°–1300° C.). Methods which have been previously utilized to achieve periodic etching of torch-deposited films include (1) cycling of the oxygen supply to the torch nozzle and (2) alternating the position of the depositing film between two different torch flames, one oxygen rich and the other oxygen deficient.

Tzeng and Phillips report on the cyclic deposition of diamond carried out using an oxygen-acetylene torch. Tzeng and colleagues maintained a constant flow of acetylene for combustion in a flame. In addition to the acetylene, excess oxygen was introduced into the flame. The amount of oxygen flowing to the flame tip was introduced in a pulsed (i.e. intermittent) fashion for varying durations of time creating a cyclic process wherein the gas mixture burning in the flame was an oxygen rich (i.e. etch) acetylene mixture alternating with an oxygen poor (i.e. growth) acetylene mixture. The total cycle time, $t_{cycle}$, was varied from 50 seconds to 10 minutes and the growth fraction, $\tau_{growth}$, was set at 0.8. The paper by Tzeng and Phillips entitled Minimization of Infrared Absorption of Flame Deposited Diamond Films by Sequential Deposition and Etching Processes appearing in PROC. ELECTROCHEM. SOC. 2ND INTERN. SYMP. ON DIAMOND MATERIALS, edited by A. J. Purdes, J. C. Angus, R. F. Davis, B. M. Meyerson, K. E. Spear and M. Yoder, THE ELECTROCHEMICAL SOCIETY, Pennington, N.J., pp. 49–56 (1991), is incorporated herein by reference in its entirety and for all purposes, outlines their process. Tzeng and Phillips note several factors which need to be accurately controlled in order to grow reproducible high quality diamond films:

To achieve a reproducible high quality diamond film by the oxy-acetylene flame method, the acetylene/oxygen flow ration must be controlled very accurately. This is further complicated by the fact that acetone present in the acetylene cylinder influences the oxy-acetylene flame to a varied extent depending on the ambient temperature and the acetylene pressure in the cylinder, i.e. the fraction of acetone included in the acetylene flow varies from experiment to experiment. Although activated charcoal is used in our experimental setup, a slight change in the flame is still present from run to run, presumably due to a small temperature induced drift in the electronics of the mass flow controllers and the residual acetone incorporated into the oxy-acetylene flame. In order to compare several experimental runs, we chose to keep the length of the acetylene feather constant for each deposition by slightly adjusting the electronic mass flow controller set-points.

(Emphasis added.) See id. at pp. 50.

The various methods for carrying out a cyclic growth/etch are reviewed in a paper by Cline et al. entitled Cyclic deposition of diamond: Experimental testing of model predictions appearing in J. Appl. Phys., Vol. 72, No. 12, pp. 5926–5940 (15 Dec. 1992), incorporated herein by reference in its entirety and for all purposes. Cline et al. remark with respect to the Wang et al. reference cited, supra, that the $t_{cycle}$ and $\tau_{growth}$ parameters cited by Wang et al. "could not be attained due to equipment limitations." Emphasis added. See Cline et al. at pp. 5927. In fact, none of the papers reviewed have disclosed an apparatus wherein the advantages of a $t_{cycle}$=30 ms or less and $\tau_{growth}$ of 0.9 or greater have been explored.

While it is noted that Mucha et al., Ravi, and Wang et al. utilize a cyclic process for diamond film growth by microwave plasma CVD, there remains a need for a cyclic process for diamond film growth and single crystal diamond growth wherein the parameters of $t_{cycle}$ and $\tau_{growth}$ can be manipulated wherein $t_{cycle}$ is under about 150 ms and $\tau_{growth}$ is about 0.9 or greater in order to produce higher quality diamond of larger size at a greater growth rate without the flow controller complications encountered. For example, Tzeng et al., supra, have stated that the "acetylene/oxygen must be controlled very accurately." See id. at pp. 50. A simpler apparatus and method needs to be designed to achieve and surpass the results obtained by other investigators thus far. In addition, there is a need for an apparatus and method capable of growing high quality diamond denoted, for example, by a Raman spectrum lacking peaks indicating non-diamond contamination. More particularly, there is a need for an apparatus and method capable of growing high quality diamond which has a Raman spectrum wherein the diamond peak at 1332 $cm^{-1}$ has a full width at half maximum (FW HM) between about 3–4 $cm^{-1}$. The smaller the value of FWHM the greater the quality and purity of the diamond. Generally, naturally found diamond has a FWHM value of between 2.5–3.0 $cm^{-1}$. Generally, synthetic diamond has a FWHM value of about 5.0$cm^{-1}$. In addition, there is a need for an apparatus and a method for growing such exemplary high quality diamond at an exemplary rapid growth rate of between about 50–100 μm per hour or greater.

SUMMARY OF THE INVENTION

It is therefore an object of the present invention to provide an apparatus and method capable of growing high quality diamond denoted by a Raman spectrum lacking peaks indicating non-diamond contamination.

It is therefore another object of the present invention to provide an apparatus and method capable of growing high quality diamond which has a Raman spectrum wherein the diamond peak at 1332 cm$^{-1}$ has a full width at half maximum (FWHM) of not more than between about 3–4 cm$^{-1}$.

It is therefore yet another object of the present invention to provide an apparatus and method capable of growing high quality diamond (FWHM≦3–4 cm$^{-1}$) at a rapid growth rate.

It is therefore a further object of the present invention to provide an apparatus and method capable of growing high quality diamond (FWHM≦3–4 cm$^{-1}$) at a rapid growth rate of, at least, 50–100 μm per hour.

It is therefore an even further object of the present invention to provide an apparatus and method capable of growing high quality diamond (FWHM≦3–4 cm$^{-1}$) at a rapid growth rate of, at least, 50–100 μm per hour by flame chemical vapor deposition.

These and other objects are accomplished by placing a suitable substrate to be coated under a CVD flame and providing a disk or face plate or other shapes having one or more teeth (or holes) wherein upon rotation of the disk, or face plate, or other shape, the teeth attached to the disk, or face plate, or other shape obstruct the path of the flame from contacting the substrate at a desired time scale of $\tau_{growth}$ and $t_{cycle}$. In the case of holes within the disk, face plate or other shape, the holes do not obstruct the path of the flame from contacting the substrate at a desired time scale of $\rho_{growth}$ and $t_{cycle}$.

BRIEF DESCRIPTION OF THE DRAWINGS

FIG. 2 is that of a control diamond film grown without the growth-etch cycling, but otherwise using identical deposition parameters.

FIG. 3a is an SEM photograph of an exemplary diamond film deposited without growth-etch cycling on the apparatus schematically depicted in FIG. 1. Note that the crystals do not appear to show the large 100 faces as seen in FIG. 3a.

DETAILED DESCRIPTION OF THE PREFERRED EMBODIMENTS

The following detailed description of the invention is provided to aid those skilled in the art in practicing the present invention. However, the following detailed description of the invention should not be construed to unduly limit the present invention. Variations and modifications in the embodiments discussed may be made by those of ordinary skill in the art without departing from the scope of the present inventive discovery.

Figure 1A:
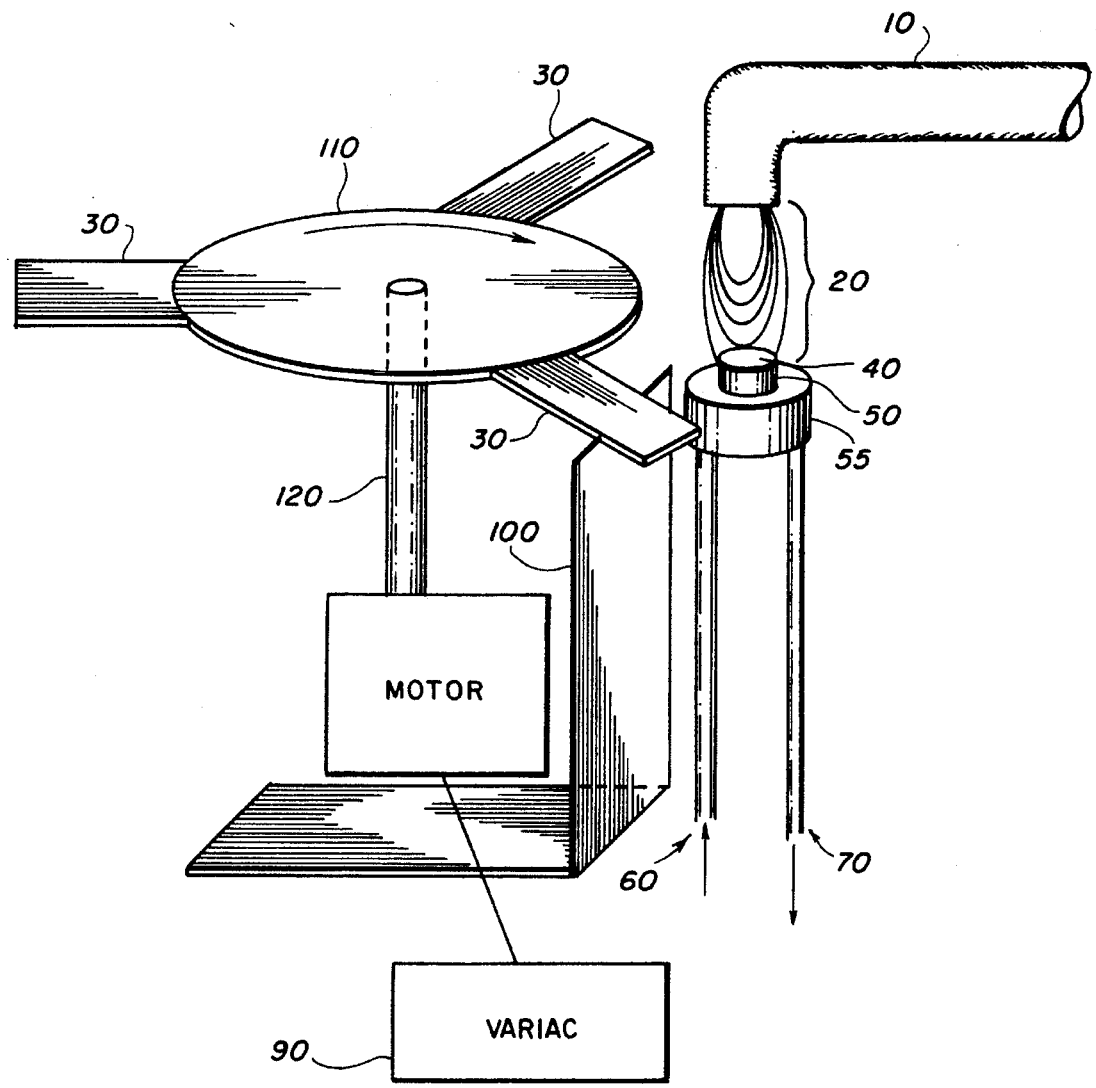
FIG. 1a is a schematic of the exemplary apparatus of FIG. 1b for the growth-etch cycling of flame deposited diamond films, single crystals or polycrystalline diamonds wherein the CVD flame is NOT obstructed from reaching the substrate at a later time (i.e with respect to FIG. 1b).
Figure 1B:
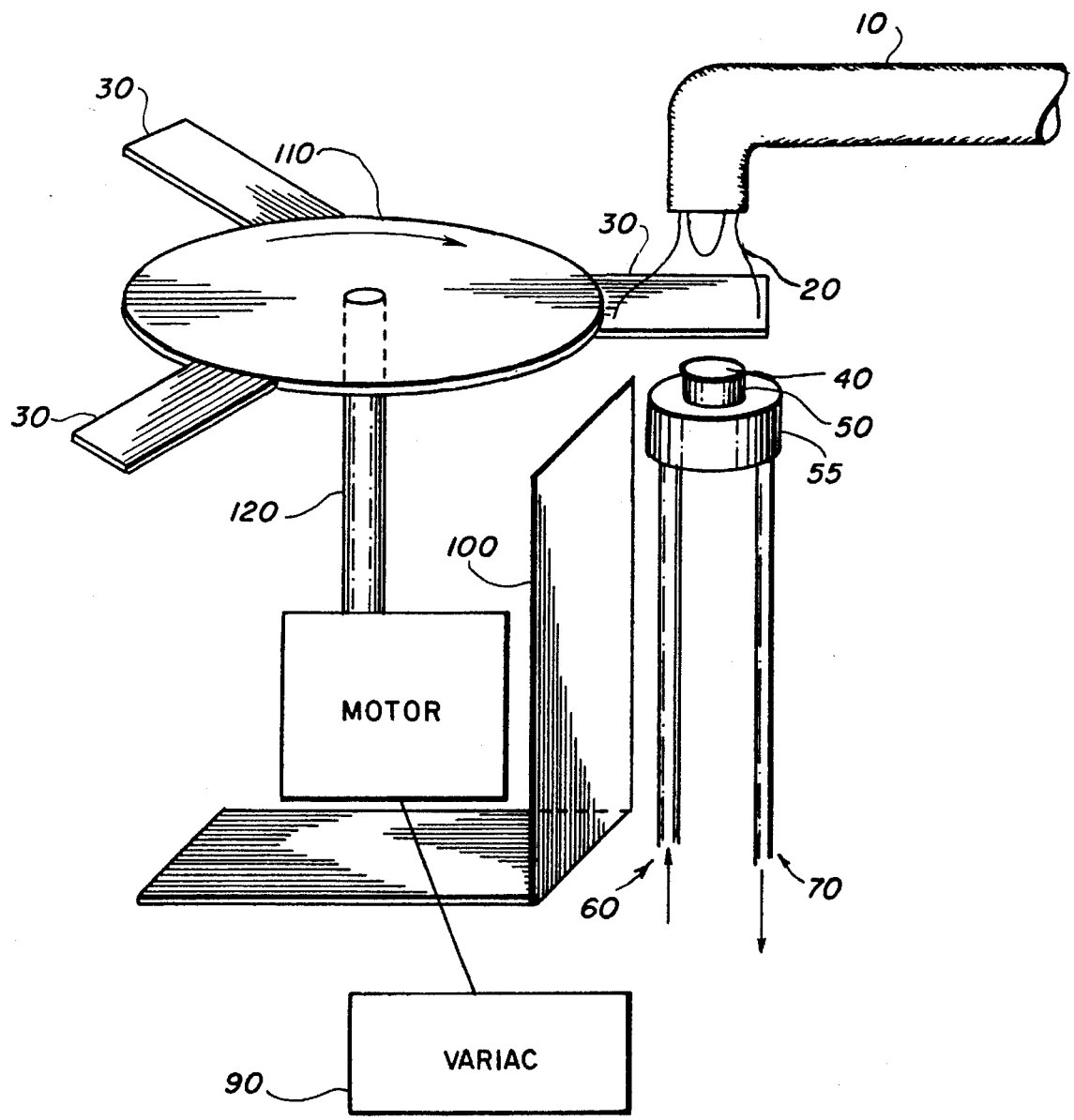
FIG. 1b is a schematic of an exemplary apparatus for the growth-etch cycling of flame deposited diamond films, single crystals, or polycrystalline diamonds wherein the CVD flame is momentarily obstructed from reaching the substrate.

FIG. 1b depicts an exemplary apparatus for the cyclic growth-etch deposition of diamond films, single crystals, or polycrystalline diamonds on a substrate 40 by a CVD flame 20. FIG. 1b depicts the position of one or more teeth 30 wherein the CVD flame 20 is obstructed by tooth 30 whereby the CVD flame 20 does not reach substrate 40. FIG. 1a depicts the same apparatus of FIG. 1b at a later time. FIG. 1a depicts the position of one or more teeth 30 wherein the CVD flame 20 is NOT obstructed by any of the one or more teeth 30 wherein the CVD flame 20 does reach substrate 40.

Comparison of FIGS. 1b and 1a show the CVD flame 20 to be obstructed and then unobstructed from reaching the substrate 40, respectively. While the motion of disk (or face plate) 110 is exemplarily shown in FIGS. 1a and 1b to be clockwise (as viewed from the top) it is not necessary that the exemplary disk 110 be limited to such motion or rotation. It is, however, necessary to move disk 110 such that the CVD flame 20 is intermittently obstructed from reaching substrate 40. Thus, for example, disk 110 may be rotated continuously clockwise, continuously counterclockwise, first clockwise then counterclockwise or vice versa on in some combination of motions thereof to achieve the intermittent obstruction of the CVD flame 20 from reaching the substrate 40. FIGS. 1a and 1b only depict one exemplary motion of disk 110 to achieve the intermittent obstruction of the CVD flame 20. As previously stated, the present invention facilitates the cyclic growth-etch deposition of diamond wherein growth occurs for a time $t_{growth}$ and etching occurs for a time $t_{etch}$, the sum of which times is equal to the time required for one growth period $t_{growth}$ followed by one etch period $t_{etch}$ and denoted as the cycle time $t_{cycle}$. In addition, it is useful to consider the fraction of the cycle time $t_{cycle}$ that is occupied by the growth time $t_{growth}$. This fraction is denoted by the ratio $\tau_{growth}$ which is equal to the ratio of the $t_{growth}$ to the $t_{cycle}$.

Referring to FIGS. 1a and 1b, acetylene torch 10 produces the CVD flame 20 which CVD flame 20 is obstructed (FIG. 1b) or not (FIG. 1a) by one or more teeth 30 from reaching substrate 40. Substrate 40 is mounted upon substrate mount 50. Typically, a silicon chip (or other suitable material) is melted and resolidified (in vacuum) onto a polished screw (substrate mount 50) threaded into the coolant block 55 (threads not shown). The substrate mount 50 may be made from any material having a melting point above about 700° C. and otherwise stable under flame CVD conditions. For example, the substrate mount 50 may be made from any group I, II, III, IV, V, VI metal or mixtures thereof. An exemplary metal used for forming the substrate mount 50 is molybdenum.

The substrate mount 50 is threaded into a coolant block 55 which coolant block has coolant fluid (a thermally conductive fluid) flowing through an internal hollow cavity (internal cavity not shown) within the coolant block. The coolant block 55 is made of a thermally conductive material.

The thermally conductive material is any material that dissipates heat at a rate which maintains the substrate 40 at a temperature between 600° to 1600° C. during chemical vapor deposition. Typically, these thermally conductive materials have heat capacities, $C_p°$ (Joules/deg-mol), between 15–50 Joules/deg-mol at 273.15° K. or thermal conductivities between 0.5–6.0 W/cm-° K. at 273° K. in the broadest ranges. The intermediate and preferred ranges for the thermal conductivity of thermally conductive materials suitable for the present invention are 1.0–5.0 W/cm-° K. and 2.0–4.5 W/cm° K., respectively, at 273° K. In addition, the thermally conductive material is any material that is stable and unreactive with the substrate mount 50 between 150–600° C. The preferred thermally conductive material is copper with a heat capacity $C_p°$ of 24.13 Joules/deg-mol at 273.15° C. and a thermal conductivity of 4.01 W/cm-° K. at 273° K.

The coolant fluid flowing through the internal cavity (not shown) is a thermally conductive fluid. The internal cavity (not shown) of the thermally conductive material (coolant block) has flowing through the cavity (not shown) a thermally conductive fluid entering into the cavity (not shown) through inlet 60 and exiting out of the cavity (not shown) through outlet 70. The fluid absorbs heat away from the thermally conductive material. The temperature of the thermally conductive material can be controlled by a heat-exchanging cooling fluid such as chilled water or water at room temperature.

The thermally conductive fluid is any fluid that dissipates heat at a rate which maintains the substrate 40 temperature between 600°–1600° C. during chemical vapor deposition. Typically, the thermally conductive fluid is any fluid that does not react with the thermally conductive material between about 20°–100° C. and has a heat capacity or thermal capacity, $C_p°$ (Joules/deg-mol), of between about 3–5 Joules/deg-mol at 273° K. The preferred thermally conductive fluid is water with a thermal capacity of 4.2177 Joules/gm-deg at 273.15° K.

The diamond is grown onto substrate 40 by the burning of a CVD flame 20. As the oxygen-acetylene mixture burns to form the flame, the intermediate products of the combustion of $O_2$ and $C_2H_4$ form the sources of the hydrogen and carbon needed to promote chemical vapor deposition of diamond. The ratio of $O_2/C_2H_2$ that is fed into the burner to form CVD flame 20 is a very important variable in the growth of diamond in a flame. The preferred range for the $O_2C_2H_2$ ratio is between 0.98–1.09. If the ratio is too low more graphite is grown than diamond, and if the ratio is too high there is no net diamond growth. In the first preferred embodiment, the optimum $O_2/C_2H_2$ ratio is about 1.05. In addition, the total flow rate of the oxygen (99.975%) and acetylene(99.6%), in the first preferred embodiment, was held at a constant of approximately 19 standard liters per minute.

Referring to FIGS. 1a and 1b, one or more teeth 30 extend from disk 110 for a distance sufficient to block CVD flame 20 when one of the teeth is positioned between CVD flame 20 and substrate 40 as depicted in FIG. 1b. Note that the one or more exemplary teeth 30 may be of any shape which allows the obstruction of the CVD flame 20 from reaching substrate 40 when positioned between the CVD flame 20 and the substrate 40 without otherwise interfering with the CVD diamond deposition process.

Typically, the one or more teeth 30 are made from a material having a melting point greater than or equal to 200° C. For example, the one or more exemplary teeth 30 may be made from materials having a melting point greater than or equal to 300° C., 400° C., or 500° C., respectively. The one or more teeth 30 may be made from exemplary metals such as Al, Fe, Cu, Mo, Ni or mixtures thereof.

The number of exemplary one or more teeth 30 and their spacing is such that the desired values of $t_{cycle}$ and $\tau_{growth}$ are obtained, as discussed, infra. Typically, the number of one or more teeth 30 are an integral number between 1 to 100, inclusive.

The disk 110 attached to the one or more teeth 30 is not limited to the shape of a relatively planar disk. It is sufficient that disk 110 have any shape wherein movement of disk 110 causes the one or more teeth 30 to intermittently (or periodically) obstruct the CVD flame 20 from reaching substrate 40 and the disk (or other shape) does not otherwise interfere with the CVD deposition of diamond onto substrate 40. For example, instead of a circular disk 110, the disk may have an oval shape, a square shape, a spherical (i.e. 3 dimensional shape) shape or some other irregular shape. It is possible to fashion disk 110 into a shape wherein teeth 30 are made of the same material as that of disk 110 and wherein teeth 30 are a continuous extension of disk 110. Thus, any shape disk 110 may be used which allows one to intermittently block the CVD flame 20 from reaching substrate 40. For example, a disk 110 having one or more holes instead of teeth may be used wherein when a hole is between the CVD flame 20 and substrate 40, the CVD flame 20 is unobstructed and thus reaches substrate 40; however, when one or more of the holes is not between the CVD flame 20 and substrate 40, the disk 110 blocks the flame 20 from reaching substrate 40.

Beyond the ability to periodically (or intermittently) block and unblock the path of the CVD flame 20 from reaching substrate 40, it is necessary to be able to control the various growth-etch parameters. These parameters include both $t_{cycle}$, and $\tau_{growth}$, supra.

As previously stated, $t_{cycle}$ and $\tau_{growth}$ represent the following:

(1) $t_{cycle}=t_{growth}+t_{etch}$ and (2) $\tau_{growth}=(t_{growth}/t_{cycle}.$ When $t_{cycle}$ and $\tau_{growth}$ are properly controlled, diamond films, single crystal diamonds and polycrystalline diamonds having a purity indicated by the characteristic diamond macro-Raman peak full-width-half-maximum (FWHM) of between 1–20 $cm^{-1}$ between 1320–1350 $cm^{-1}$ are obtained. The characteristic diamond Raman peak occurs at 1332 $cm^{-1}$. Typically, characteristic diamond macro-Raman peak FWHMs of about 1–6 $cm^{-1}$, about 1–3 $cm^{-1}$ and about 2.5–3 $cm^{-1}$ are possible by precise control of $t_{cycle}$ and $\tau_{growth}$. The total cycle times $t_{cycle}$ are, typically, between about 1 to about 1000 milliseconds (ms), between about 5 to about 100 milliseconds (ms), between about 10 to about 30 milliseconds (ms) and between about 15 to about 20 milliseconds (ms), respectively. The ratios $\tau_{growth}$ are, typically, between about 0.10 to about 0.99, between about 0.75 to about 0.98, between about 0.85 to about 0.97, between about 0.93 to about 0.96 and about 0.94 to about 0.95, respectively. Optimum results (FWHM of about 2.5–3.5 $cm^{-1}$) have been obtained at $t_{cycle}$ and $\tau_{growth}$ equal to 20 ms and 0.95, respectively. In addition to controlling the $t_{cycle}$ and $\tau_{growth}$ to the desired values stated, supra, it is also preferable to minimize any variations in the $t_{cycle}$ and $\tau_{growth}$ to between about 5 to about 10 percent, respectively.

Assuming a constant exemplary rotation speed of disk 110, $t_{cycle}$ can be controlled by the number of exemplary teeth 30 attached to exemplary disk 110. The greater the number of teeth 30 on the same size disk 110, the shorter the cycle time $t_{cycle}$. Conversely, the greater the distance between teeth 30, the longer the cycle time $t_{cycle}$. For an exemplary disk 110 having the same number of exemplary teeth 30, the exemplary rotational speed is inversely related to the cycle time $t_{cycle}$.

In addition, for a constant cycle time $t_{cycle}$, the longer the time during which the CVD flame 20 is obstructed, the longer is the etching time $t_{etch}$ and the shorter is the growth time $t_{growth}$, within one growth-etch cycle. As the $t_{growth}$ is decreased while holding $t_{cycle}$ constant, the value of the ratio is also proportionately decreased and vice versa.

Figure 2:
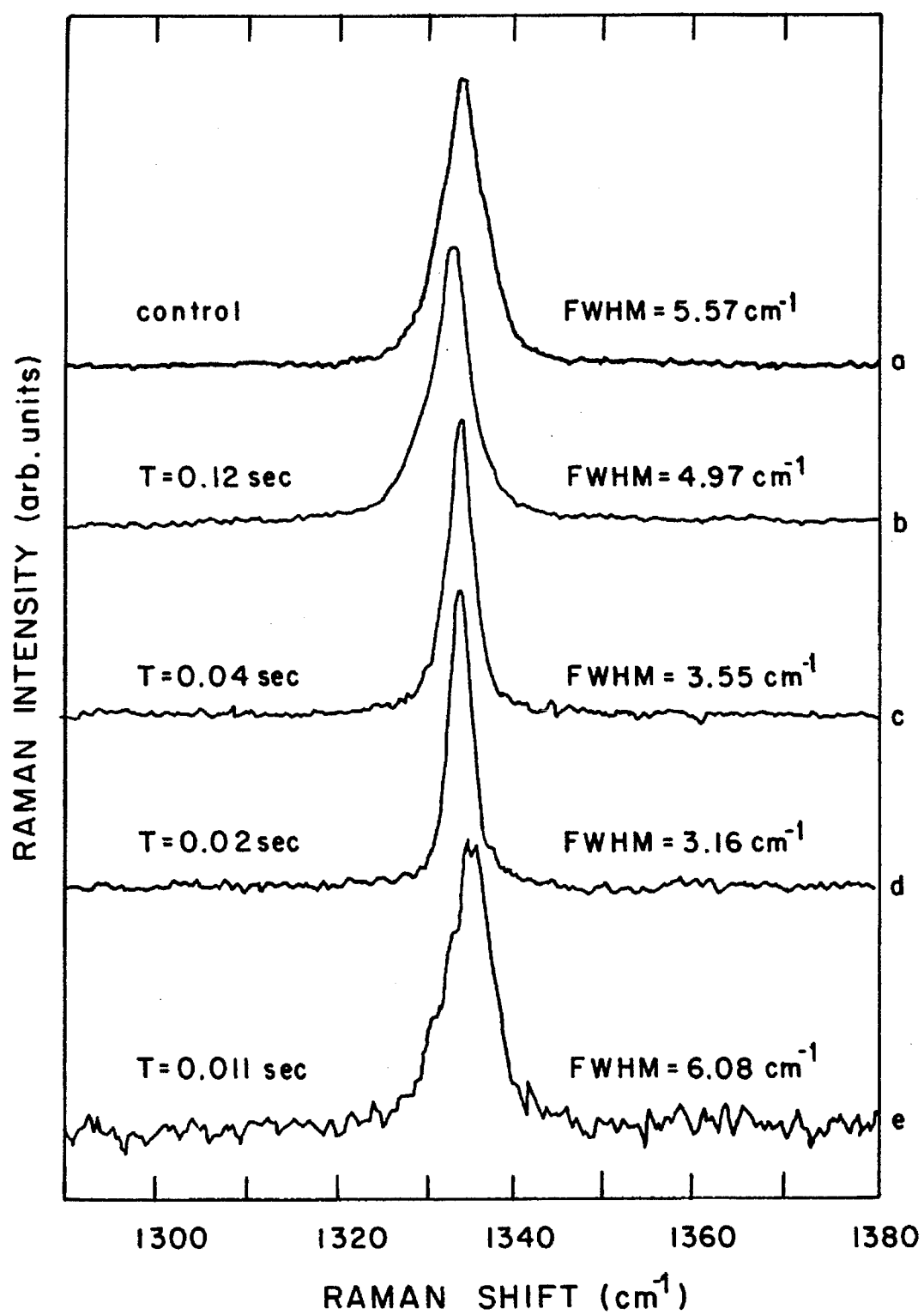
FIG. 2 depicts Raman spectra for diamond films deposited with variously indicated cycling times using the described growth-etch apparatus and technique. Spectra at the top of this

The effect of varying $t_{cycle}$ on the quality of diamond obtained is indicated in FIG. 2. Plots b, c, d, and e of FIG. 2 correspond to cycle times $t_{cycle}$ of 120 ms, 40 ms, 20 ms and 11 ms, respectively. Plot a of FIG. 2 corresponds to that of a diamond grown continuously wherein $t_{etch}$ equals zero milliseconds (ms). In addition, plods b, c, d, and e of FIG. 2 correspond to a ratio $\tau_{growth}$ of 0.95, respectively.

Figure 3A:
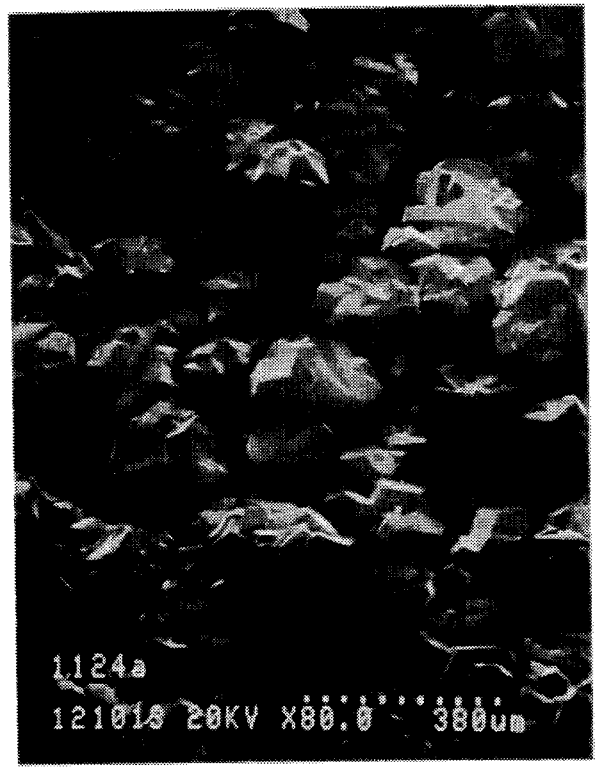
Figure 3B:
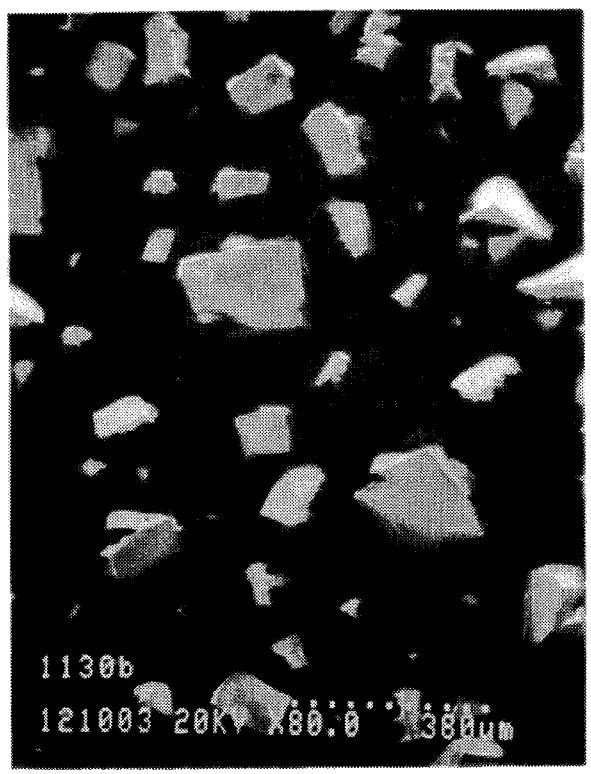
FIG. 3b is an SEM (scanning electron microscope) photograph of an exemplary diamond film deposited with the growth-etch cycling apparatus and method at an exemplary optimum cycling frequency (narrowest observed FWHM). A predominance of large 100 crystal faces are evident for the film deposited with the growth-etch cycling apparatus and method.

FIGS. 3a and 3b show SEM photos of films deposited without (3a) growth-etch cycling and with (3b) growth-etch cycling at $t_{cycle}$, equal to 20 ms and $\tau_{growth}$ equal to 0.95, respectively.

Figure 4:
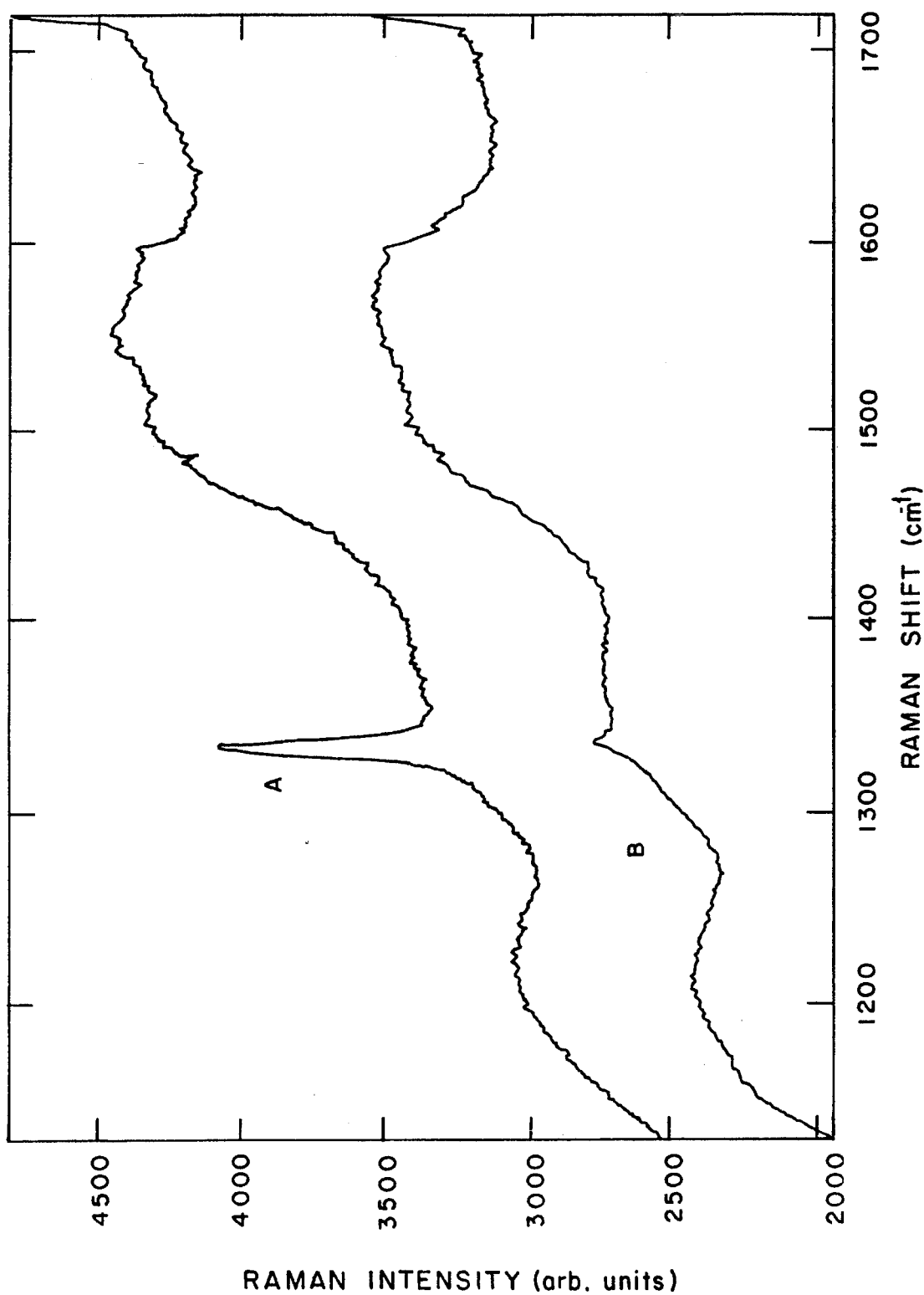
FIG. 4 is a Raman spectra for two diamond films wherein the Raman spectra labeled as A corresponds to the film wherein the growth-etch cycling apparatus and method of the present invention are used. The Raman spectra labeled B corresponds to the film wherein the growth-etch cycling apparatus and method of the present invention is not used.

Shown in FIG. 4 are Raman spectra for two films grown with an acetylene excess of 10%, both with (4A) and without (4B) growth-etch cycling. As can be seen, only the film grown with growth-etch cycling exhibits a strong diamond peak. A practical acetylene excess maximum without growth-etch cycling is about 5%.

The motion of exemplary disk 110 is via the attachment means 120 (i.e. rod 120 attached to disk 110). While exemplary rod 120 is depicted in FIGS. 1a and 1b, the rod 120 can be of any shape or size which allows movement of disk 110 in a manner sufficient to achieve the desired values of the $t_{cycle}$ and $\tau_{growth}$ parameters previously discussed, supra. In addition, while disk 110 is shown to have an exemplary rotation in the clockwise direction when viewed from the top in FIGS. 1a and 1b, respectively, movement of disk 110 by movement of rod 120 can be clockwise, counterclockwise, or clockwise then counterclockwise or vice versa or some other non-rotational motion or translational motion wherein the desired cycle time $t_{cycle}$ and the ratio $\tau_{growth}$ are obtained.

The exemplary rod 120 is attached to a motor 80 which provides the force necessary to move both the rod 120 and the exemplary disk 110. The motor in turn is attached to a variable power supply which allows control of the speed with which exemplary rod 120 is rotated and in turn the speed at which disk 110 is rotated. Typically, the rod 120 and disk 110 are rotated between about 50 to 500 revolutions per minute (rpm). More typically, the rod 120 and disk 110 are rotated between about 75 to 300 revolutions per minute (rpm). Most typically, the rod 120 and disk 110 are rotated between about 100 to 200 revolutions per minute (rpm). Preferably, the rod 120 and disk 110 are rotated between about 150 to 180 revolutions per minute (rpm).

As shown in FIGS. 1a and 1b, an exemplary heat shield 100 protects motor 80 from the heat emanating from CVD flame 20. Typically, the heat shield is made from an heat resistant and chemically stable material within the proximity of the CVD flame 20. An exemplary heat shield of steel was used in one preferred embodiment.

Having described the invention, the following examples are given to illustrate specific applications of the invention, including the best mode now known to perform the invention. These specific examples are not intended to limit the scope of the invention described in this application.

EXAMPLE

The present invention (apparatus and method) is accomplished by use of a spinning wheel with up to 60 removable teeth, in analogy to optical choppers (See FIG. 1). The wheel is positioned so that the tip of each tooth passes between the torch nozzle and the depositing film, periodically disrupting the flame and exposing the film to the surrounding environment. Film deposition takes place in open atmosphere, so that oxygen etching occurs on the heated film surface during each flame interruption. Growth-etch parameters are changed by variation of the substrate temperature, adjustment of oxygen/acetylene flow ratio, removal or addition of teeth, and/or varying the speed of the wheel.

All films were deposited onto silicon-coated (for better film adhesion) molybdenum substrates. Typically, a silicon chip was melted and resolidified (in vacuum) onto a polished molybdenum substrate, then annealed at ~1200° C. for 2–3 min. This resulted in a thick (>10 µm) polycrystalline layer with an average grain size of approximately 20 µm. The silicon layer was then seeded with 6 µm diamond grit. The first 15 min. of deposition was done without growth-etch cycling in order to nucleate a continuous diamond film. Deposition then continued for ~3 hrs. with growth-etch cycling. For films characterized in this study a substrate temperature of 950° C. was maintained. A maximum growth rate was determined to be between 150 to about 200 µm/h from examination of films under an optical microscope. The diamond formed at these growth rates (i.e. 150 to 200 µm/h) exhibited a FWHM of between 2.5 to 3.5 $cm^{-1}$ at the characteristic Raman peak at 1332 $cm^{-1}$. These growth rates achieved using the presently claimed invention are about 2 to 3 times larger than those growth rates achieved to form diamond of similar quality without the use of the presently claimed invention. A #4 torch tip was used, with oxygen and acetylene flow rates adjusted before deposition, using visual examination, to achieve a neutral flame. The acetylene flow rate was then increased by ~0.3 slm (~3% of initial acetylene flow) for deposition. The growth/etch time ratio was held at 19, with total cycling time used as the independent variable.

Shown in FIG. 2 are Raman spectra for diamond films grown at various growth-etch cycling times, as well as a control sample grown under identical conditions, but without growth-etch cycling. Continuous increases in film quality are observed for decreasing cycling times, as measured by Raman peak widths (full width at half maximum), down to a cycling time of 0.02 sec. A peak width of approximately 3 $cm^{-1}$ is observed for that film, comparable to the highest quality films deposited in closed CVD systems. Shorter cycling times (to a point) should enhance the quality of deposited films as the thickness of unetched surface layer decreases inversely with time. Etching of non-diamond carbon phases is therefore less limited by oxygen diffusion into the film as the cycling time decreases.

Film morphology has been significantly altered by the growth-etch apparatus and method of the present invention. Shown in FIG. 3 are SEM photos of two films (same magnification) grown without (3a) and with (3b) growth-etch cycling at the optimum frequency (narrowest observed Raman peak width). The film subject to growth-etch cycling exhibits a predominance of large 100 crystal faces. Dimensions of the largest faces exceed 300 µm. The average dimension of crystalline faces on the unetched sample is seen to be significantly smaller, with a much more random distribution of crystallographic orientations.

The apparatus and method of the present invention allows diamond growth over a substantially wider range of oxygen/acetylene gas flow ratios than possible without its use. In particular, it is observed that diamond growth with an acetylene excess of more than 10% (as measured relative to a neutral flame) is now possible. Without use of our procedure films deposited under those conditions are substantially graphite. Shown in FIG. 4 are Raman spectra for two films grown with an acetylene excess of 10%, both with (A) and without (B) growth-etch cycling. As can be seen, only the film grown with growth-etch cycling exhibits a strong diamond peak. A practical acetylene excess maximum without growth-etch cycling is about 5%. The ability to use a larger acetylene flow range lowers the risk that inadvertent drift of gas flow rates during long term growths will produce poor quality films. Use of larger acetylene excesses also expands the inner cone of the torch flame, which in turn expands the area of the substrate over which high quality film deposition will occur.

What is claimed is:

1. A chopper for the cyclic growth-etch deposition of diamond on a substrate by flame chemical vapor deposition (CVD), said chopper comprising:

(a) a means for periodically obstructing a CVD flame from reaching said substrate; and (b) an attachment means for moving said obstructing means, said attachment means being attached to said obstructing means wherein movement of said attachment means causes said obstruction means to periodically obstruct said CVD flame from reaching said substrate such that $t_{cycle}$ is between about 1 to about 1000 ms and such that $\tau_{growth}$ is between about 0.10 to about 0.99.

2. The chopper of claim 1 wherein said $t_{cycle}$ and said $\tau_{growth}$ have a variation of not more than from about 5 percent to 10 percent.

3. The chopper of claim 2 wherein said means for obstructing further comprises a disk having a relatively planar orientation, having an outer perimeter and having one or more relatively co-planar teeth, said teeth attached to said disk at said outer perimeter.

4. The chopper of claim 3 wherein said attachment means further comprises a rod having a central axis along its length.

5. The chopper of claim 4 wherein said rod is attached to said disk wherein said central axis is relatively perpendicular to said planar orientation of said disk.

6. The chopper of claim 5 wherein said teeth are removable.

7. The chopper of claim 6 wherein said disk is circular.

8. The chopper of claim 1 wherein said $t_{cycle}$ is between about 5 to about 100 ms and said $\tau_{growth}$ is between about 0.75 to about 0.98, respectively.

9. The chopper of claim 1 wherein said $t_{cycle}$ is between about 10 to about 30 ms and said $\tau_{growth}$ is between about 0.85 to about 0.97, respectively.

10. The chopper of claim 1 wherein said $t_{cycle}$ is between about 15 to about 20 ms and said $\tau_{growth}$ is between about 0.93 to about 0.96, respectively.

11. The chopper of claim 1 wherein said $t_{cycle}$ is about 20 ms and said $\tau_{growth}$ is between about 0.94 to about 0.95, respectively.

12. The chopper of claim 2 wherein said variation in said $t_{cycle}$ and said $\tau_{growth}$ is between about 1 to about 3 percent, respectively.

13. The chopper of claim 6 wherein said disk is made of a material selected from the group consisting of aluminum, iron, copper, molybdenum, nickel and mixtures thereof.

14. The chopper of claim 6 wherein said teeth are made from a material selected from the group consisting of aluminum, iron, copper, molybdenum, nickel and mixtures thereof.

15. A method for the cyclic growth-etch deposition of diamond on a substrate by flame chemical vapor deposition (CVD), said method comprising the steps of:

(a) obstructing a CVD flame for a time $t_{etch}$ by rotating a disk having a perimeter and having one or more teeth attached to said disk at said perimeter wherein said teeth block said CVD flame from reaching said substrate;

(b) further rotating said disk wherein said teeth are moved out of said CVD flame for a time $t_{growth}$; and (c) further rotating said disk wherein steps (a) and (b) are repeated whereby a growth-etch cycle is established for a time $t_{cycle}$ wherein said $t_{cycle}$ is the sum of said $t_{etch}$ and said $t_{growth}$.

16. The method of claim 15 wherein a ratio $\tau_{growth}$ of $t_{growth}$ divided by $t_{cycle}$ is between about 0.10 to about 0.99.

17. The method of claim 16 wherein said ratio $\tau_{growth}$ is between about 0.75 to about 0.98 and said $t_{cycle}$ is between about 1 milliseconds to about 1000 milliseconds.

18. The method of claim 16 where said ratio $\tau_{growth}$ is between about 0.85 to about 0.97 and said $t_{cycle}$ is between about 5 milliseconds to about 100 milliseconds.

19. The method of claim 16 wherein said ratio $\tau_{growth}$ is between about 0.93 to about 0.96 and said $t_{cycle}$ is between about 10 milliseconds to about 30 milliseconds.

20. The method of claim 16 wherein said ratio $\tau_{growth}$ is about 0.95 and said $t_{cycle}$ is about 20 milliseconds.

21. The method of claim 15 wherein said ratio $\tau_{growth}$ and said cycle time $t_{cycle}$ are selected wherein said diamond has a characteristic diamond macro-Raman peak full-width-half-maximum (FWHM) of between about 1 to about 10 $cm^{-1}$ at 1332 $cm^{-1}$.

22. The method of claim 15 wherein said ratio $\tau_{growth}$ and said cycle time $t_{cycle}$ are selected wherein said diamond has a characteristic diamond macro-Raman peak full-width-half-maximum (FWHM) of between about 1 to about 6 $cm^{-1}$ at 1332 $cm^{-1}$.

23. The method of claim 15 wherein said ratio $\tau_{growth}$ and said cycle time $t_{cycle}$ are selected wherein said diamond has a characteristic diamond macro-Raman peak full-width-half-maximum (FWHM) of between about 1 to about 3 $cm^{-1}$.

24. The method of claim 15 wherein said ratio $\tau_{growth}$ and said cycle time $t_{cycle}$ are selected wherein said diamond has a characteristic diamond macro-Raman peak full-width-half-maximum (FWHM) of between about 2.5 to about 3.5 $cm^{-1}$ at 1332 $cm^{-1}$.

* * * * *